(12) United States Patent
Sakaino et al.

(10) Patent No.: US 7,049,698 B1
(45) Date of Patent: May 23, 2006

(54) SEMICONDUCTOR INTEGRATED CIRCUIT HAVING TRANSISTOR WITH REDUCED RESISTANCE

(75) Inventors: Yasutaka Sakaino, Tokyo (JP); Jouji Kato, Tokyo (JP); Yoshiaki Umezawa, Tokyo (JP)

(73) Assignee: Oki Electric Industry, Co., Ltd., Tokyo (JP)

( * ) Notice: Subject to any disclaimer, the term of this patent is extended or adjusted under 35 U.S.C. 154(b) by 913 days.

(21) Appl. No.: 09/229,628

(22) Filed: Jan. 13, 1999

(30) Foreign Application Priority Data

Feb. 2, 1998 (JP) .......................... 10-021021

(51) Int. Cl.
*H01L 23/48* (2006.01)
*H01L 23/52* (2006.01)
*H01L 29/40* (2006.01)

(52) U.S. Cl. ........................ 257/758; 257/382
(58) Field of Classification Search ................ 257/382, 257/758, 355, 365, 360
See application file for complete search history.

(56) References Cited

U.S. PATENT DOCUMENTS 5,844,281 A * 12/1998 Narita ......................... 257/356
5,936,283 A * 8/1999 Narita et al. ................. 257/355

FOREIGN PATENT DOCUMENTS

JP 6-232345 8/1994

* cited by examiner

*Primary Examiner*—Phat X. Cao
(74) *Attorney, Agent, or Firm*—Venable, LLP; Michael A. Sartori; Jeffri A. Kaminski

(57) ABSTRACT

An increase in the overall resistance value of a transistor is prevented by having different contact resistances for connections between conductors in different wiring layers. The transistor has a first conductive layer having a first resistivity formed over impurity diffusion regions, a first contact group connecting the first conductive layer and the impurity diffusion regions through holes, a second conductive layer having a second resistivity formed over the first conductive layer, and a second contact group connecting the first conductive layer and the second conductive layer through holes. The first contact group and the second contact group have a different total number of contacts.

19 Claims, 6 Drawing Sheets

SEMICONDUCTOR INTEGRATED CIRCUIT HAVING TRANSISTOR WITH REDUCED RESISTANCE

BACKGROUND OF THE INVENTION

1. Technical Field

The present invention relates to a semiconductor integrated circuit, and particularly to a layout pattern for a semiconductor integrated circuit.

2. Related Art

Conventionally, transistors utilizing high resistance polysilicon wiring have been used in MOS transistors that have to be protected against static electricity surges in the vicinity of pads of input protection circuits and output circuits and surge voltage is relieved by utilizing resistive components of the polysilicon wiring.

FIG. 3 is a circuit diagram of an output circuit. FIG. 4-B is a layout pattern drawing of an NMOS transistor having conventional circuitry, and FIG. 4-A schematically shows a cross section of FIG. 4-B. The layout pattern shown in FIGS. 4-A and 4-B is disclosed in Japanese Patent Publication 6-232345, published on Aug. 19, 1994. The output circuit and the layout will now be described below using the drawings.

In the output circuit, the NMOS transistor 301 has a gate connected to a terminal 302 for receiving a signal from an internal circuit, a drain connected to an output terminal 303 and a source connected to GND 304. This NMOS transistor 301 is in a conducting state when a signal supplied to the gate is at an H level. At this time, an L level signal is output from the output terminal 303. When the signal supplied to the gate is an L level, the NMOS transistor 301 is in a non-conducting state, and at this time an H level signal is output from the output terminal 303.

The conventional pattern layout of an NMOS transistor used in this type of circuit will be described in more detail.

As shown in FIGS. 4-A and 4-B, the NMOS transistor has a source 405 connected to a conductor in a polysilicon wiring layer 402 arranged over a source region, via first contacts 401.

The conductor in the polysilicon wiring layer 402 over the source is connected to a conductor in a first metal layer 403 arranged over the same source 405 region, via a second contacts 404. The conductor in the first metal layer 403 is connected to GND.

A drain 406, similar to the source 405, is connected to a conductor in the polysilicon wiring layer 402 arranged over a drain region, via first contacts 401. The conductor in the polysilicon wiring layer 402 over the drain 406 is connected to a conductor in the first metal layer 403 arranged over the drain 406, via second contacts 404. The conductor in the first metal layer 403 over the drain 406 is connected to an output terminal.

Here, the contacts 401 and the contacts 404 are arranged so as to alternate, as shown in FIG. 4-B.

In the above described conventional circuit, the first contacts 401 and the second contacts 404 are alternately arranged without considering the difference between the resistance value of the first contacts 401 and the resistance value of the second contacts 404. Accordingly, the total resistance value of all the contacts will become large. There is thus a problem in that the I-V characteristic of the MOS transistor will be degraded by this increase in the resistance value of the contact portions.

SUMMARY OF THE INVENTION

An object of the present invention is to lower the overall resistance value. According to an example of the present invention, there is provided a semiconductor integrated circuit device, comprising, impurity diffusion regions formed as a source and a drain on a semiconductor substrate; a first conduction layer having conductors with a first resistively formed over the impurity diffusion regions; a first contact group connecting the first conduction layer and the impurity diffusion regions; a second conduction layer having conductors with a second resistively formed over the first conduction layer; and a second contact group connecting the first conduction layer and the second conduction layer, wherein the total number of contacts in the first contact group is different from the number of contacts in the second contact group.

DESCRIPTION OF THE PREFERRED EMBODIMENTS (First Embodiment)

Figure 3:
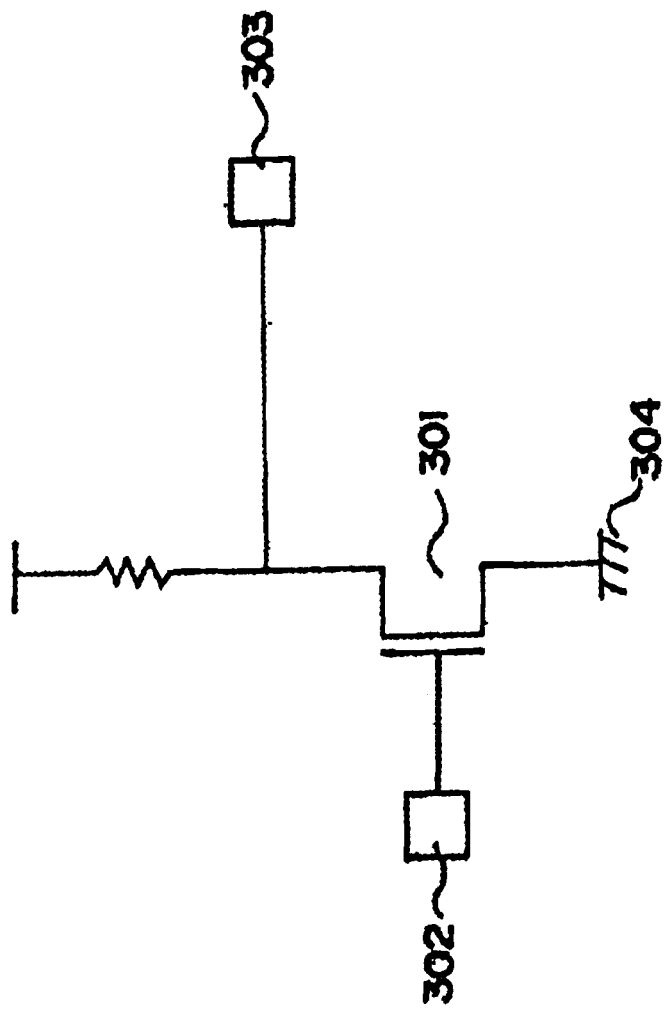
FIG. 3 is a circuit diagram of an output circuit.

A circuit diagram showing an output circuit of a first embodiment of the present invention is the same as FIG. 3. As shown in FIG. 3, the NMOS transistor 301 of the output circuit has a gate connected to a terminal 302 for receiving a signal from an internal circuit, a drain connected to an output terminal 303 and a source connected to GND 304. This NMOS transistor 301 is in a conducting state when a signal supplied to the gate is at an H Level. At this time, an L Level signal is output from the output terminal 303. When the signal supplied to the gate is an L Level, the NMOS transistor 301 is in a non-conducting state, and at this time an H Level signal is output from the output terminal 303.

Figure 1:
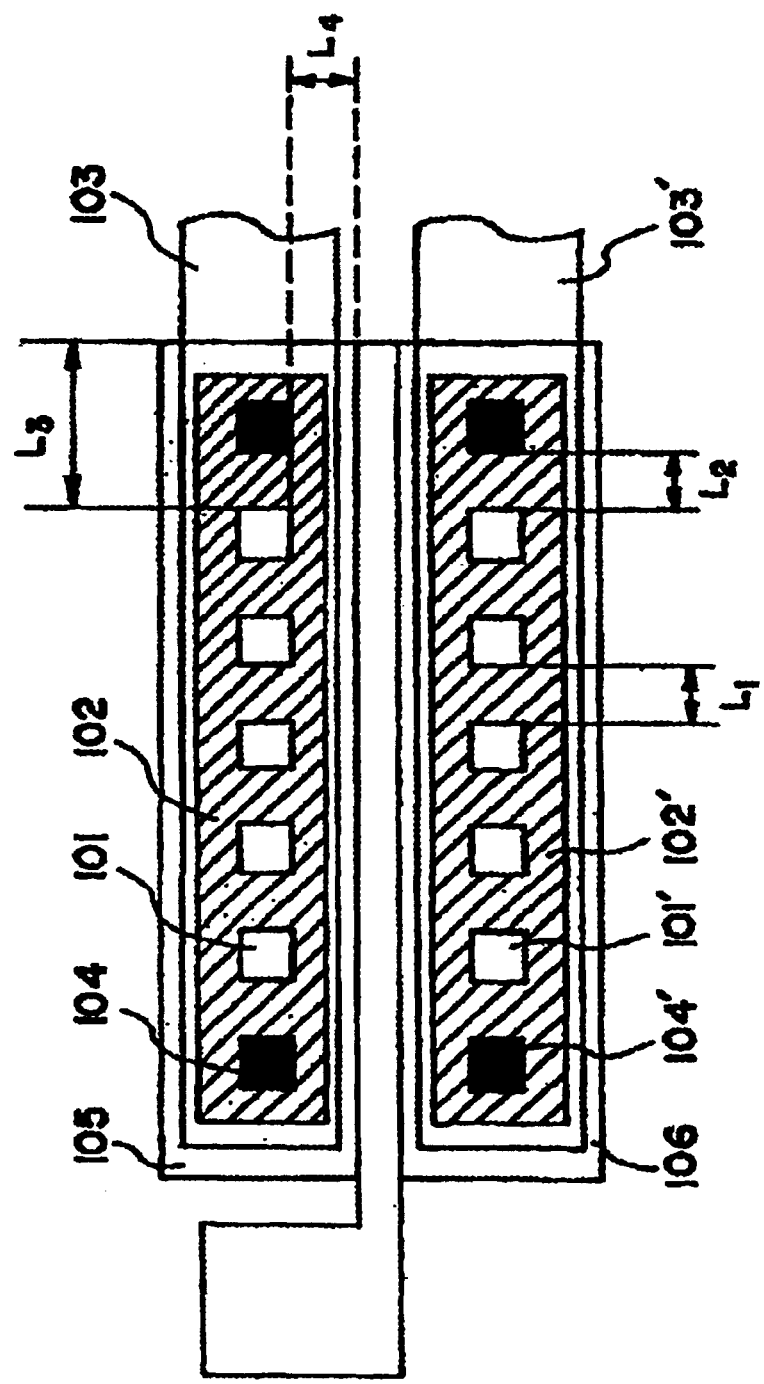
FIG. 1 is a layout drawing showing a pattern layout of a first embodiment of the present invention.

FIG. 1 is a drawing showing a pattern layout used in the case of the present invention. The layout structure of an NMOS transistor of the present invention will now be described below using FIG. 1.

A polysilicon layer 102, constituting a first high resistance wiring layer, and a first metal layer 103, constituting a second low resistance wiring layer, are formed on respective regions of a source 105 and a drain 106.

The source 105 and drain 106 of the NMOS transistor are connected to respective conductors in the first wiring layer, being the polysilicon layer 102, via a plurality of first contacts 101. The first contacts are each formed having a size of 0.6 μm by 0.7 μm. A contact resistance between the source or drain and the first wiring layer is 170 Ω/unit in terms of sheet resistance.

The conductors in the first wiring layer, being the polysilicon layer 102, and the respective conductors above them in the second wiring layer, being a first metal layer 103, are connected via a plurality of second contacts 104. The second contacts are each formed having a size of 0.7 μm by 0.7 μm. A contact resistance between the first wiring layer 102 and the second wiring layer 103 is 9.5 Ω/unit in terms of sheet resistance.

Here, the contact resistance of portions of the source 105 and the drain 106 where the first contacts 101 are formed is larger than the contact resistance of portions where the second contacts 104 are formed.

As shown in FIG. 1, with respect to the pattern layout of the present invention, in order to lower the overall resistance, a plurality of first contacts 101 are arranged inside the area between the second contacts 104. In this embodiment, five first contacts 101 are arranged between two second contacts 104. An interval L1 between each first contact 101 is set to a fixed value of 1 μm.

The distance L2 when a first contact 101 is adjacent to a second contact 104 is also a fixed value, and in FIG. 1 it is 1 μm.

A distance L3 is a distance from the edge of the source 105 or drain 106 to a hole for a first contact 101, and a distance L4 is a distance from a gate electrode to a hole for a first contact 101, and the holes for the first contacts are arranged so that L3>L4. In this embodiment, L3=5.25 μm.

The conductor in the first metal layer 103 over the source 105 is connected to GND, while the conductor in the first metal layer 103 over the drain region 106 is The conductor in the first metal layer 103 over the source 105 is connected to GND, while the conductor in the first metal layer 103 over the drain region 106 is connected to an output terminal.

Figure 2:
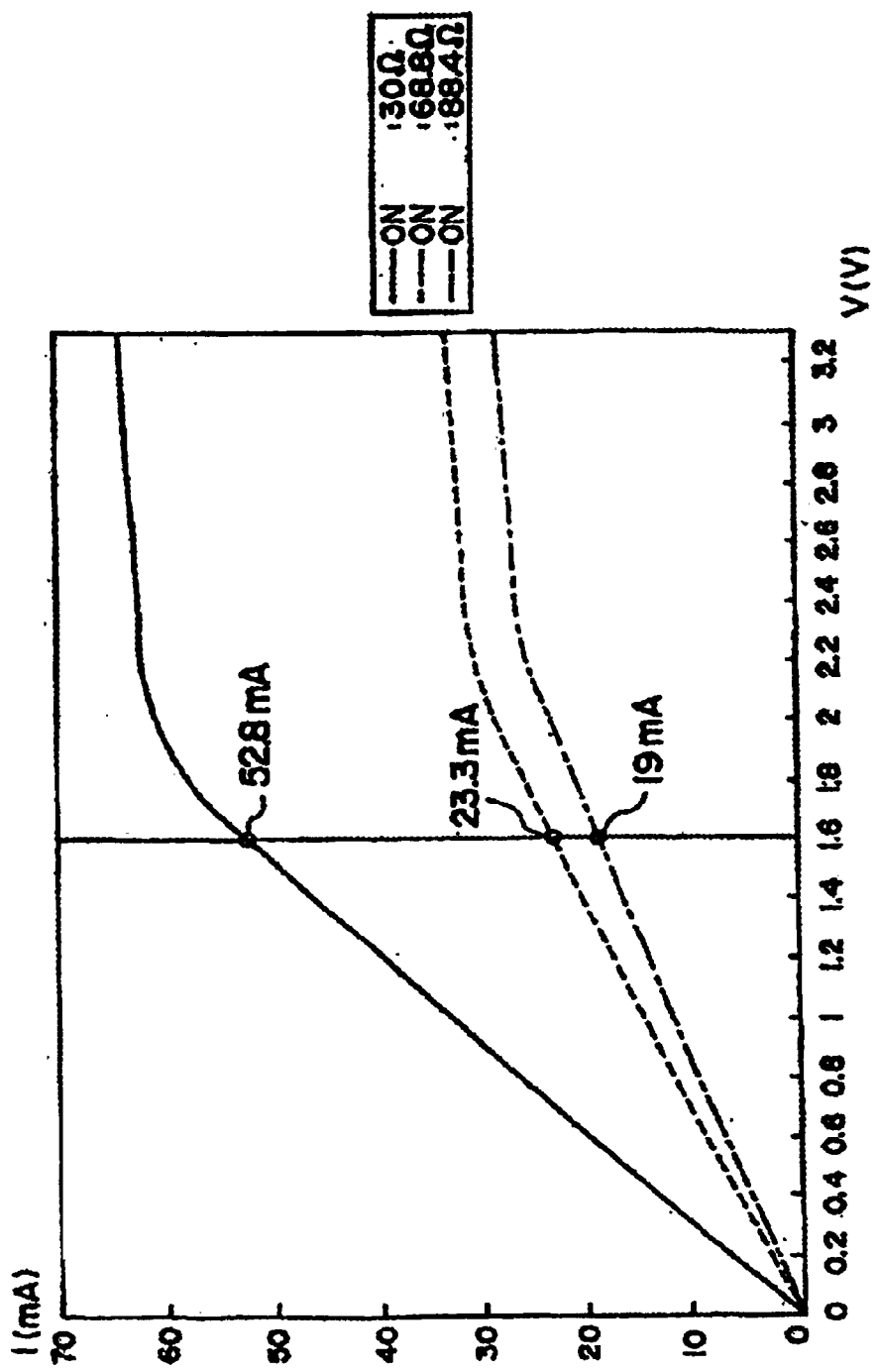
FIG. 2 is an I-V characteristic drawing showing improved characteristics brought about by the present invention.

The operation of the first embodiment of the present invention will be described below. The characteristic of drain current against drain voltage for the NMOS transistor (I-V characteristic) is shown in FIG. 2. The characteristic shown in FIG. 2 is a characteristic for the case where the ON resistance of the NMOS transistor 301 of FIG. 3 is 30.

If a layout pattern such as that in FIG. 1 is used, the resistance of the first contacts is 34 Ω (170/5) and the resistance of the second contacts is 4.8 Ω (9.5/2). Accordingly, the ON resistance of the NMOS transistor becomes 30+34+4.8=68.8 Ω. The drain voltage at which the NMOS transistor actually operates is approximately 1.6V. With the drain voltage at 1.6V in this case, a current of 23.3 mA flows.

Figure 4A:
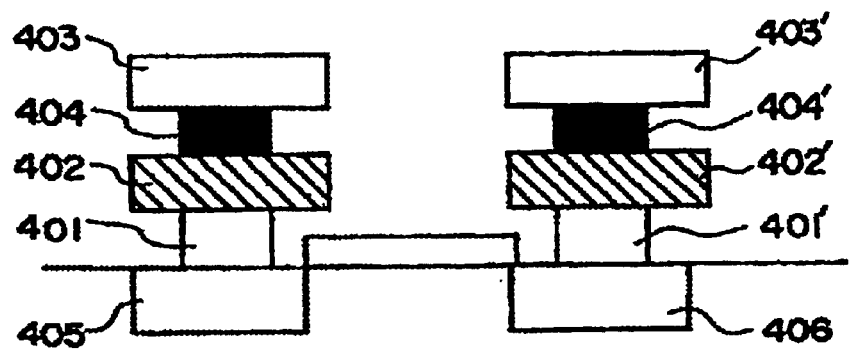
FIGS. 4-A and 4-B are layout drawings showing a pattern layout of the related art.
Figure 4B:
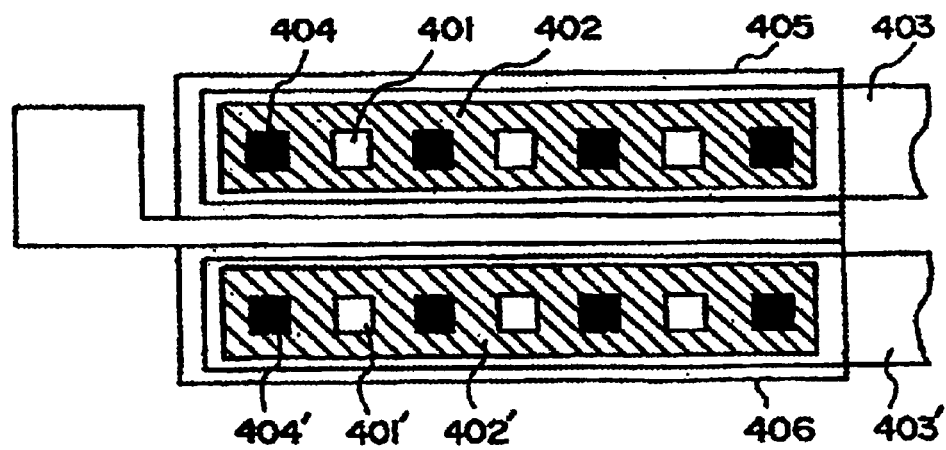

On the contrary, if the I-V characteristic is measured using the conventional pattern layout shown in FIG. 4-B, the resistance of the first contacts is 56 Ω (170/3 and the resistance of the second contacts is 2.4 Ω (9.5/4).

The overall ON resistance becomes 30+56+2.4=88.4 Ω. In other words, with the drain voltage at 1.6V, a current of only 19 mA will flow.

With an I-V characteristic in a hypothetical ideal state where there is absolutely no contact resistance, a current of 52.8 mA will flow with a voltage of 1.6V. With the NMOS transistor using the pattern layout of the present invention, a current reduced to 44% compared to that of this ideal state will flow. Compared to this, a current flow in an NMOS transistor using the conventional pattern layout is reduced by more than 64%.

By using the present invention, an improvement of 20% can be expected. In order to thus reduce the overall contact resistance, a plurality of first contacts 101 are arranged inside the area between the second contacts 104. As a result, compared to the related art, the overall contact resistance of the NMOS transistor is reduced, and the current driving capability is improved.

Since a plurality of first contacts 101 are arranged between the second contacts 104, overall, current will flow in either of the first wiring layer or the second wiring layer in a well balanced manner.

By setting the interval between the multiply arranged first contacts 101 to a predetermined fixed interval, the length of the conductor segments in the polysilicon wiring layer 101 between each contact 101 is equal. That is, the individual resistance of the polysilicon layer between the contacts 101 is equal. As a result, a surge voltage is uniformly distributed and overall protection against surge voltages is stable, even if a surge such as static is temporarily input to the output terminals.

The holes for the first contacts are arranged so that a distance L3 from the edge of the source 105 or drain 106 to a first contact 101, and a distance L4 from the gate electrode to a first contact 101, satisfy L3>L4. When surges such as static are input, the surge voltage will be converged on a portion located between an edge of the diffusion region and a first contact 101 extremely close to the edge, and there is no fear of damage to the diffusion region.

(Second Embodiment)

Figure 5:
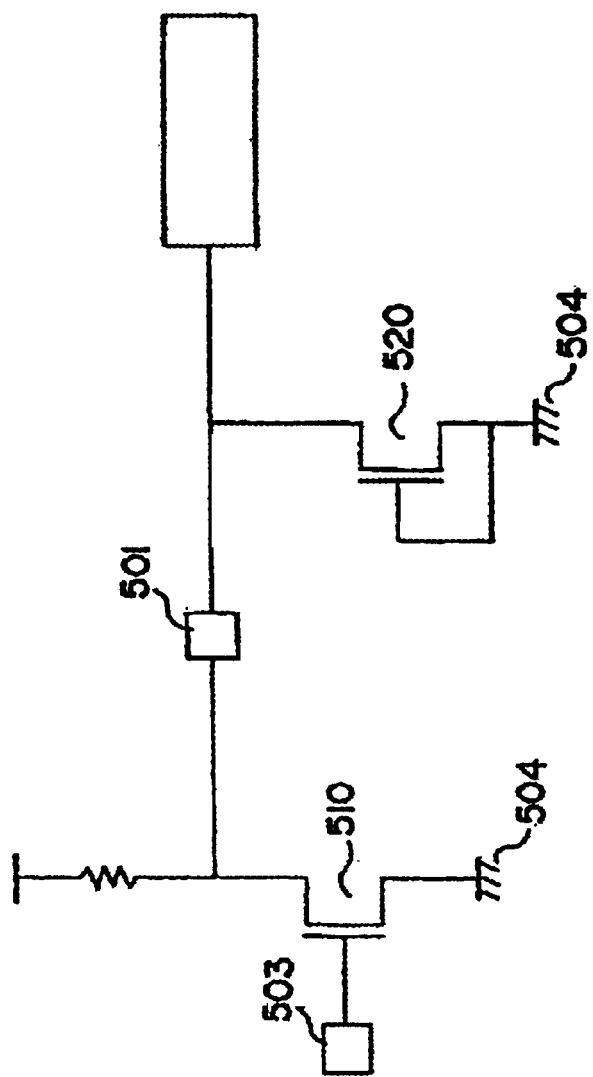
FIG. 5 is a circuit diagram of an input/output circuit.

FIG. 5 is a circuit diagram showing an input/output circuit of the second embodiment of the present invention. As shown in FIG. 5, an NMOS transistor 510 in the output circuit has a gate connected to a terminal 503 for receiving a signal from internal circuitry, a drain connected to an input/output terminal 501, and a source connected to GND 504. The NMOS transistor 510 is in a conducting state when an H Level signal is supplied to the gate. At that time, an L Level signal is output from the input/output terminal 501. When an L Level signal is supplied to the gate, the NMOS transistor 510 is in a non-conducting state, and an H Level signal is output to the input/output terminal 501.

An NMOS transistor 520 in the input circuit portion has a drain connected to the input/output terminal 501, and the source and gate are connected to GND 504. This NMOS transistor 520 functions as a protection element to shunt static surges etc., from the NMOS transistor 510 in the output circuit portion, and from the input/output terminal 501, to GND 504.

Figure 6A:
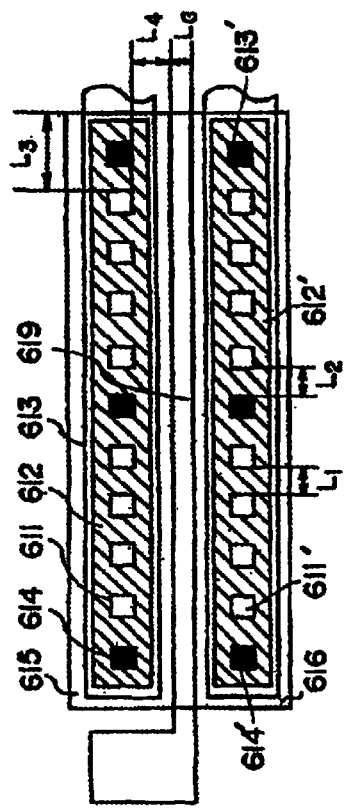
FIGS. 6-A and 6-B are layout drawings showing a pattern layout of a second embodiment of the present invention.
Figure 6B:
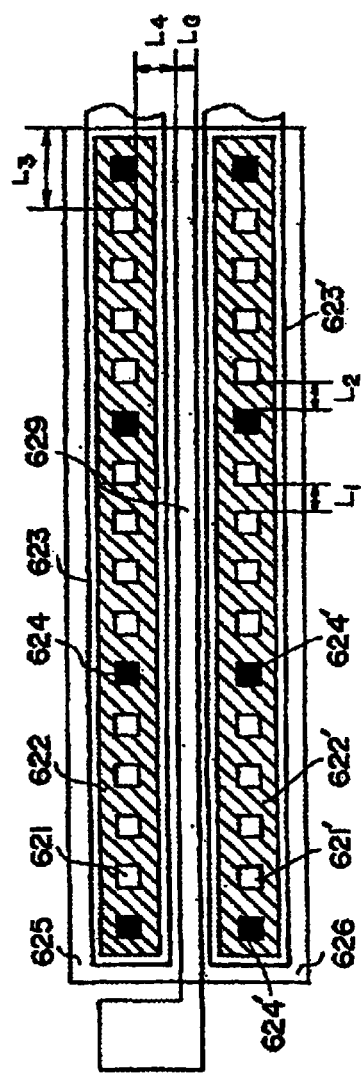

FIG. 6-A and FIG. 6-B respectively show pattern layouts for the NMOS transistor 510 and the NMOS transistor 520 in FIG. 5. The transistor layout structure of the present invention will be described below using FIG. 5 and FIGS. 6-A and 6-B.

As shown in FIG. 6-A, in the NMOS transistor 510 of the output circuit side in FIG. 5, a gate electrode 619 having a gate width LG of 0.9 μm is formed over an active region of the NMOS transistor 510. A polysilicon layer 612 constituting a first high resistance wiring layer, and a first metal layer 613 constituting a second wiring layer, are formed to provide conductors over a source 615 and a drain 616.

The source 615 and drain 616 of the NMOS transistor are respectively connected to conductors in the polysilicon layer 612, being the first wiring layer, through a plurality of first contacts 611. The first contacts are formed having a size of 0.6 μm by 0.7 μm.

The conductors in the polysilicon layer 612, being the first wiring layer, are connected to conductors in the first metal layer, being the second wiring layer, through a plurality of second contacts 614. The second contacts 614 are formed having a size of 0.6 μm by 0.7 μm.

Here, the contact resistance of the source 615, drain 616 and the part where the first contacts 611 are formed, is larger than the contact resistance of the portion where the second contacts 614 are formed.

As shown in FIG. 6-A, with the pattern layout of the present invention, the first contacts 611 are multiply arranged at fixed intervals between the second contacts 614, so as to reduce the overall contact resistance. In this embodiment, the second contacts 614 are arranged at three places, and four first contacts are respectively arranged in portions positioned between neighboring contacts 614. An interval L1 between adjacent first contacts has a fixed value of 1 μm.

The contacts are arranged so that a distance L2 between adjacent first and second contacts is always equal, and in this embodiment it is 1 μm. A distance from the edge of the source 615 or drain 616 to a first contact 611 is termed L3, while a distance from a gate electrode to a contact is termed L4, and the contacts are arranged to satisfy the relationship L3>L4. In this embodiment L3=5.25 μm.

In the input circuit side NMOS transistor 520 of FIG. 5, as shown in FIG. 6-B, a gate electrode 629 having a gate width LG of 0.9 μm is formed over an active region of the NMOS transistor 520. A polysilicon layer 622 constituting a first high resistance wiring layer, and a first metal layer 623 constituting a second wiring layer, are formed over a source 525 and a drain 626.

The relationship between the first and second contacts and the respective wiring layers is the same as the relationship in the output circuit. The input circuit side differs from the output side only in that, because the length of the active region is greater than in the output circuit portion, the number of second contacts is different from that on the output side, and second contacts are arranged at four places.

Specifically, an interval L1 between adjacent first contacts is the same as an interval set in the transistor formed in the output circuit, and in this embodiment it is fixed at 1 μm. An interval between first contacts and second contacts is also exactly the same as the interval set for the transistor formed in the output circuit and that is also 1 μm in this embodiment.

A detailed description will be given below of the operation when a static surge, as previously described, is applied to the input/output terminal 501 of FIG. 5.

When a negative voltage of −1000V, caused by static electricity etc., is applied to the input/output terminal 501 in FIG. 5, the NMOS transistors 510 and 520 are both in an ON state. The applied static electricity is shunted by the flow of current from GND to the input/output terminal 501.

When there is a disparity between the input circuit side NMOS transistor 520 and the output circuit side NMOS transistor 510, the current for diverting the applied voltage will flow more in one transistor that the other. If more current flows in one transistor than the other, the load will be concentrated in the side having the increased current flow. Accordingly, protection of the overall circuit against static electricity etc. is lowered.

In the second embodiment, as has been described above, the gate widths have been made equal in the input side and the output side. Contact arrangement intervals etc. have also been adjusted so as to be the same at the input side and the output side. With this type of structure, the same current flows in both of the NMOS transistors, and the load is evenly shared between the input side and the output side.

In the second embodiment, in addition to the effects of the first embodiment, the respective pattern layouts of the input side NMOS transistor and the output side NMOS transistor are constructed having the same relationship. In this way, it is possible to improve the resistance to static electricity etc. of the circuit overall.

The ratio of the number of first contacts to the number of second contacts in the invention described above is suitably variable according to the desired overall resistance etc., but in order to sufficiently obtain the effects of the present invention, the unit resistance of the first contacts is preferably designed so as to be no more than ten times the unit resistance of the second contacts.

What is claimed is:

1. A semiconductor integrated circuit device, comprising:
a source region formed on a semiconductor substrate;
a first conductor having a first resistivity formed over said source region;
a first contact group having a plurality of first contacts connecting said source region and said first conductor, the first contacts being formed over said source region;
a second conductor having a second resistivity over said first conductor;
a second contact group having a plurality of second contacts connecting said first conductor and said second conductor, the second contacts being formed over said source region;
a drain region formed on said semiconductor substrate;
a third conductor having said first resistivity formed over said drain region;
a third contact group having a plurality of third contacts connecting said drain region and said third conductor, the third contacts being formed over said drain region;
a fourth conductor having said second resistivity formed over said third conductor;
a fourth contact group having a plurality of fourth contacts connecting said third conductor and said fourth conductor, the fourth contacts being formed over said drain region;
wherein a total number of the first contacts is different from a total number of the second contacts, and a total number of the third contacts is different from a total number of the fourth contacts.

2. The semiconductor integrated circuit device as claimed in claim 1, wherein the total number of contacts in said first contact group is the same as the total number of contacts in said third contact group, and the total number of contacts in said second contact group is the same as the total number of contacts in said fourth contact group.

3. The semiconductor integrated circuit device as claimed in claim 2, wherein said first resistivity is higher than said second resistivity, and a total number of contacts in said first contact group and in said third contact group is greater than a total number of contacts in said second contact group and in said fourth contact group.

4. A semiconductor integrated circuit device, comprising:
a first impurity diffusion region and a second impurity diffusion region formed on a semiconductor substrate, extending in a first direction and standing side by side in a second direction;
a first conductor having a first resistivity formed over said first impurity diffusion region;
a first contact group, having a plurality of first contacts arranged side by side in said first direction over said first impurity diffusion region, for connecting said first impurity diffusion region and said first conductor;
a second conductor having a second resistivity formed over said first conductor;
a second contact group, having a plurality of second contacts arranged side by side in said first direction over said first impurity diffusion region, for connecting said first conductor and said second conductor;
a third conductor having said first resistivity formed over said second impurity diffusion region;
a third contact group, having a plurality of third contacts arranged side by side in said first direction over said second impurity diffusion region, for connecting said second impurity diffusion region and said third conductor;

a fourth conductor having said second resistivity formed over said third conductor; and a fourth contact group, having a plurality of fourth contacts arranged side by side in said first direction over said second impurity diffusion region, for connecting said third conductor and said fourth conductor, wherein said first contact group is arranged between neighboring contacts of said second contact group, and wherein said third contact group is arranged between neighboring contacts of said fourth contact group.

5. The semiconductor integrated circuit device as claimed in claim 4, wherein a distance between a contact of said first contact group and a contact of said second contact group adjacent to the contact of said first contact group is a fixed value, and a distance between a contact of said third contact group and a contact of said fourth contact group adjacent to the contact of said third contact group is a fixed value.

6. The semiconductor integrated circuit device as claimed in claim 4, wherein an interval between contacts of said first contact group situated between neighboring contacts of said second contact group is a fixed value, and an interval between contacts of said third contact group situated between neighboring contacts of said fourth contact group is a fixed value.

7. The semiconductor integrated circuit device as claimed in claim 4, wherein said first impurity diffusion region has
- a first side and a second side running in said second direction,
- a third side running in said first direction and opposite to said second impurity diffusion region,
- a first distance defined as a distance from said first side to an edge of said first contact group extremely close to said first side,
- a second distance defined as a distance from said second side to an edge of said first contact group extremely close to said second side, and
- a third distance defined as a distance from said third side to an edge of said first contact hole group extremely close to said third side, said second impurity diffusion region has
- a fourth side and a fifth side running in said second direction,
- a sixth side running in said first direction and opposite to said first impurity diffusion region,
- a fourth distance defined as a distance from said fourth side to an edge of said third contact group extremely close to said fourth side,
- a fifth distance defined as a distance from said fifth side to an edge of said third contact group extremely close to said fifth side, and
- a sixth distance defined as a distance from said sixth side to an edge of said third contact group extremely close to said sixth side, said first distance and said second distance are both larger than said third distance, and said fourth distance and said fifth distance are both larger than said sixth distance.

8. The semiconductor integrated circuit device as claimed in claim 4, wherein said first contact group is divided into a plurality of subgroups each having a predetermined fixed number of contacts, and each subgroup is arranged between adjacent contacts of said second contact group, and said third contact group is divided into a plurality of subgroups each having a predetermined fixed number of contacts, and each subgroup is arranged between adjacent contacts of said fourth contact group.

9. the semiconductor integrated circuit device as claimed in claim 8, wherein a distance from contacts of said first contact group and contacts of said second contact group adjacent to contacts of said first contact group, has a fixed value, and a distance from contacts of said third contact group and contacts of said fourth contact group adjacent ot contacts of said third contact group, has a fixed value.

10. The semiconductor integrated circuit device as claimed in claim 8, wherein an interval between contacts of said first contact group arranged between adjacent contacts of said second contact group has a fixed value, and an interval between contacts of said third contact group arranged between adjacent contacts of said fourth contact group has a fixed value.

11. The semiconductor integrated circuit device as claimed in claim 8, wherein said first impurity diffusion region has
- a first side and a second side running in said second direction,
- a third side running in said first direction and opposite to said second impurity diffusion region,
- a first distance defined as a distance from said first side to an edge of said first contact group extremely close to said first side,
- a second distance defined as a distance from said second side to an edge of said first contact group extremely close to said second side, and
- a third distance defined as a distance from said third side to an edge of said first contact hole group extremely close to said third side, said second impurity diffusion region has
- a fourth side and a fifth side running in said second direction,
- a sixth side running in said first direction and opposite to said first impurity diffusion region,
- a fourth distance defined as distance from said fourth side to an edge of said third contact group extremely close to said fourth side,
- a fifth distance defined as a distance from said fifth side to an edge of said third contact group extremely close to said fifth side, and
- a sixth distance defined as a distance from said sixth side to an edge of said third contact group extremely close to said sixth side, said first distance and said second distance are both larger than said third distance, and said fourth distance and said fifth distance are both larger than said sixth distance.

12. A semiconductor integrated circuit, comprising a first transistor for input and a second transistor for output, said first transistor and said second transistor being connected to an input/output terminal, wherein said first transistor includes a first impurity diffusion region and a second impurity diffusion region formed on a semiconductor substrate, extending in a first direction and standing side by side in a second direction;

a first conductor having a first resistivity formed over said first impurity diffusion region;

a first contact group, having a plurality of first contacts arranged side by side in said first direction over said first impurity diffusion region, for connecting said first impurity diffusion region and said first conductor;

a second conductor having a second resistivity formed over said first conductor;

a second contact group, having a plurality of second contacts arranged side by side in said first direction over said first impurity diffusion region, for connecting said first conductor and said second conductor;

a third conductor having said first resistivity formed over said second impurity diffusion region;

a third contact group, having a plurality of third contacts arranged side by side in said first direction over said second impurity diffusion region, for connecting said second impurity diffusion region and said third conductor;

a fourth conductor having said second resistivity formed over said third conductor; and a fourth contact group, having a plurality of fourth contacts arranged side by side in said first direction over said second impurity diffusion region, for connecting said third conductor and said fourth conductor, wherein said first contact group has a predetermined fixed number of the first contacts arranged between each of the neighboring second contacts, and has a first fixed interval between said first contacts and said third contact group has a predetermined fixed number of the third contacts arranged between each of the neighboring fourth contacts, and has said first fixed interval between said third contacts, and wherein said second transistor includes a third impurity diffusion region and a fourth impurity diffusion region formed on said semiconductor substrate, extending in a third direction and standing side by side in a fourth direction;

a fifth conductor having said first resistivity formed over said third impurity diffusion region;

a fifth contact group, having a plurality of fifth contacts arranged side by side in said third direction over said third impurity diffusion region, for connecting said third impurity diffusion region and said fifth conductor;

a sixth conductor having said second resistivity formed over said fifth conductor;

a sixth contact group, having a plurality of sixth contacts arranged side by side in said third direction over said third impurity diffusion region, for connecting said fifth conductor and said sixth conductor;

a seventh conductor having said first resistivity formed over said fourth impurity diffusion region;

a seventh contact group, having a plurality of seventh contacts arranged side by side in said third direction over said fourth impurity diffusion region, for connecting said fourth impurity diffusion region and said seventh conductor;

an eighth conductor having said second resistivity formed over said seventh conductor; and an eighth contact group, having a plurality of eighth contacts arranged side by side in said third direction over said fourth impurity diffusion region, for connecting said seventh conductor and said eighth conductor, wherein said fifth contact group has a predetermined fixed number of contacts arranged between each neighboring sixth contact, and has said first fixed interval between said fifth contacts, and said seventh contact group has a predetermined fixed number of seventh contacts arranged between each of the neighboring eighth contacts, and has said first fixed interval between said seventh contacts.

13. The semiconductor integrated circuit as claimed in claim 12, having a first side, for said first impurity diffusion region, running in said first direction and opposite to said second impurity diffusion region;

a second side, for said second impurity diffusion region, running in said first direction and opposite to said first impurity diffusion region;

a third side, for said third impurity diffusion region, running in said third direction and opposite to said fourth impurity diffusion region;

a fourth side, for said fourth impurity diffusion region, running in said third direction and opposite to said third impurity diffusion region;

a first distance defined as a distance between said first side and said second side; and a second distance defined as a distance between said third side and said fourth side, wherein said first distance and said second distance are equal.

14. A transistor for use in an input protection circuit that protects circuitry fabricated on a semiconductor substrate, said transistor comprising:

a source region formed on the semiconductor substrate;

a first conductor having a first resistance formed over the source region;

a first number of first contacts connecting said source region and said first conductor;

a second conductor having a second resistance which is lower than the first resistance, said second conductor being formed over said first conductor;

a second number of second contacts connecting said first and second conductors, formed over said source region;

a drain region formed on the semiconductor substrate;

a third conductor having the first resistance formed over the drain region;

a third number of third contacts connecting said drain region and said third conductor;

a fourth conductor having the second resistance formed over said third conductor;

a fourth number of fourth contacts connecting said third and fourth conductors, formed over said drain region;

a gate insulating layer formed on the semiconductor substrate between said source and drain regions; and a gate electrode formed on the gate insulating layer, wherein the first number is more than twice as large as the second number, and wherein the third number is more than twice as large as the fourth number.

15. A transistor according to claim 14, wherein the first number is equal to the third number and the second number is equal to the fourth number.

16. A transistor according to claim 14, wherein said second contacts are located over end portions of said source region and said first contacts holes are located over a central portion of said source region.

17. A transistor according to claim 14, wherein said fourth contacts are located over end portions of said drain region and said third contacts are located over a central portion of said drain region.

18. A transistor according to claim 14, wherein a distance from an end of the source region to a nearest one of the first contacts is equal to or greater than a distance from the gate electrode to said nearest one of the first contacts.

19. A transistor according to claim 14, wherein a distance from an end of the drain region to a nearest one of the third contacts is equal to or greater than a distance from the gate electrode to said nearest one of the third contacts.

\* \* \* \* \*